(12) United States Patent
Griffin et al.

(10) Patent No.: US 6,208,526 B1
(45) Date of Patent: Mar. 27, 2001

(54) MOUNTING MULTIPLE SUBSTRATE FRAME AND LEADLESS SURFACE MOUNTABLE ASSEMBLY USING SAME

(75) Inventors: Curtis M. Griffin; Jeffrey A. Rollman, both of Boca Raton; Edmund B. Boucher, Ft. Lauderdale, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/360,116

(22) Filed: Jul. 23, 1999

(51) Int. Cl.$^7$ ....................................................... H05K 1/14
(52) U.S. Cl. .................... 361/785; 361/748; 361/760; 361/764; 257/704; 257/737; 257/738; 174/250; 174/255; 174/260; 174/266
(58) Field of Search ..................................... 361/785, 748, 361/752, 760, 764; 257/704, 712, 723, 737, 738; 174/250, 255, 260, 266

(56) References Cited

U.S. PATENT DOCUMENTS

| | | | |
|---|---|---|---|
| 4,933,808 | * 6/1990 | Horton et al. | 361/715 |
| 5,036,431 | * 7/1991 | Adachi et al. | 361/803 |
| 5,049,084 | * 9/1991 | Bakke | 439/66 |
| 5,103,976 | * 4/1992 | Murphy | 206/328 |
| 5,182,632 | * 1/1993 | Bechtel et al. | 257/713 |
| 5,299,094 | * 3/1994 | Nishino et al. | 361/784 |
| 5,367,434 | * 11/1994 | Griffin et al. | 361/719 |
| 5,379,185 | 1/1995 | Griffin et al. | 361/709 |
| 5,670,824 | * 9/1997 | Weinberg | 257/723 |
| 5,777,847 | * 7/1998 | Tokino et al. | 361/705 |
| 5,796,586 | * 8/1998 | Lee et al. | 361/748 |
| 5,897,728 | * 4/1999 | Cole et al. | 156/155 |
| 6,051,878 | * 4/2000 | Akram et al. | 257/686 |

* cited by examiner

*Primary Examiner*—Jeffrey Gaffin
*Assistant Examiner*—David Foster
(74) *Attorney, Agent, or Firm*—M. Mansour Ghomeshi

(57) ABSTRACT

A multiple substrate mounting frame (104) includes first (132) and second (130) surfaces and a plurality of windows or cavities (106–112). A set of substrates having electrical circuitry (114–120) are attached and electrically connected to the first surface (132) of the mounting frame (104). The second surface (130) can then be electrically interconnected to a mother board (102). A leadless surface mountable assembly for multiple die (100) includes the mounting frame (104) which receives a plurality of substrates (114–120) and electrically interconnects them to each other and/or to a mother board (102). A heat sink (122) can be provided if the die (134, 124) generate too much heat.

16 Claims, 2 Drawing Sheets

MOUNTING MULTIPLE SUBSTRATE FRAME AND LEADLESS SURFACE MOUNTABLE ASSEMBLY USING SAME

TECHNICAL FIELD

This invention relates in general to the field of electrical assemblies, more particularly, this invention relates to substrate mounting frames and surface mountable assemblies using said frame.

BACKGROUND

When designing an electrical assembly that uses multiple integrated circuits (ICs) and especially ICs that dissipate large amounts of thermal energy (e.g., radio frequency power amplifiers, etc.), the circuit designer must take great care in resolving the thermal and mechanical interconnect issues related to such an assembly. Multiple IC assemblies (also known as "Multi-chip modules") tend to sometimes have manufacturing yield problems given that if one of the ICs in the assembly is defective, the whole assembly has to be discarded. This yield problem is especially prevalent in ICs in chip and wire form given their more delicate structure. The low yield problem is a costly problem given the number of components and manufacturing time lost when a multi-chip module assembly has to be discarded after its manufacture.

Another problem associated with multiple IC assemblies as mentioned above is the problem of how to thermally protect the ICs. The use of heat sinks mounted in thermal proximity to the ICs is well known in the art, especially when dealing with leaded power ICs. Heat dissipation techniques for surface mountable assemblies are more complex, but solutions to these problems have also been found in the art. For example, U.S. Pat. No. 5,379,185 to Griffin et al. entitled, "Leadless Surface Mountable Assembly," describes a packaging technique for thermally protecting heat generating devices in a leadless assembly. Although the noted patent provides a good solution to heat dissipation problems in a leadless assembly, it fails to address the yield problem associated with multi-chip modules mentioned above. With the push in radio communication equipment to higher and higher frequencies, and smaller and smaller equipment, there is a strong need for electronic packaging which conserves space, is easy to assembly and helps reduce manufacturing yield problems. As such, a need thus exists in the art for an assembly that can provide interconnection to several IC circuits, minimize size, improve the finished assembly's manufacturing yield and provide heat dissipation capabilities when required.

BRIEF DESCRIPTION OF THE DRAWINGS

The features of the present invention, which are believed to be novel, are set forth with particularly in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
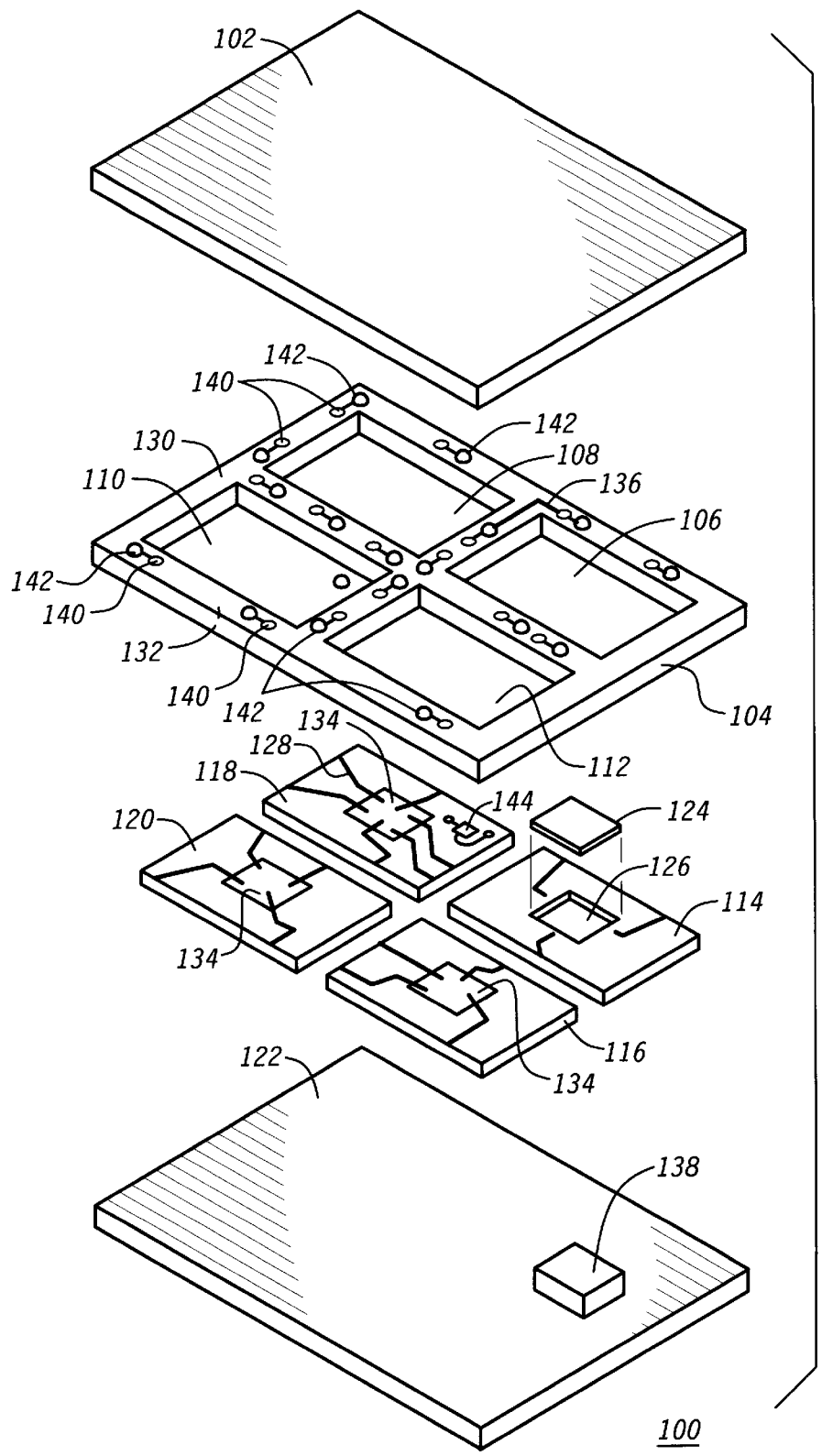
FIG. 1 shows an exploded perspective view of a multiple substrate mounting frame assembly in accordance with the present invention.

Referring now to the drawings and in particular to FIG. 1, there is shown an exploded view of a leadless surface mountable assembly 100 in accordance with the present invention. The assembly 100 includes a plurality of circuit carrying substrates or printed circuit boards 114, 116, 118 and 120 mounted to a multiple substrate mounting frame or spacer 104. The mounting frame 104 may be surface mounted to a "mother board" substrate 102. Completing the assembly is a heat sink 122, which is attached against one or more of the plurality of circuit carrying substrates 114, 116, 118 and 120 in order to provide heat dissipation to the assembly.

As shown in FIG. 1, each of the individual circuit carrying substrates or printed circuit boards 114, 116, 118 and 120 carries electrical circuitry such as one or more heat generating integrated circuits 134 or 124. Once the integrated circuits are mounted on the substrates, the individual substrate assemblies may be tested during the manufacturing process to determine if the assemblies are functional. Once the different assemblies are tested, they are mounted and interconnected together to the multiple substrate-mounting frame 104, This multiple (two or more) substrate design helps improve the manufacturing yields of the assembly 100 given that the electrical circuitry 124, 134 and 144 located on the individual substrates which make up the entire assembly 100 can be tested individually for proper operation prior to attachment of the substrates to the mounting frame 104.

Mounting frame 104 resembles a windowpane having several openings or cavities 106, 108, 110, and 112. When the mounting frame 104 is mated to mother board 102, the cavities 106, 108, 110 and 112 accommodate the electrical circuitry 124, 134 and 144 located on their corresponding substrates 114, 118, 120 and 116, respectively.

In the preferred embodiment, mounting frame has a thickness of approximately 0.020-inch and the width and length are approximately 0.5 inch. The mounting frame 104 and individual substrates 114–120 can be formed from materials typically used to construct printed circuit boards, such as FR4 glass epoxy material, ceramic, etc. Mounting frame 104 includes conductive vias 140 which form electrical conductors extending through the mounting frame 104 to electrically couple the first surface 132 of the mounting frame 104 to the second surface 130.

Solder deposits in the form of collapsible solder balls 142 are located on the mounting frame's second surface 130 to provide the electrical contacts with mother board 102. Collapsible solder balls can also interconnect the individual substrates electrical contact areas 128 to contact pads (not shown) located on the first surface 132 of mounting frame 104. Instead of using collapsible solder balls 142 other electrical interconnection techniques such as using electrical conductive epoxy or solder can be used. In the preferred embodiment, the individual substrates have a thickness of between 0.010–0.014 inch. Mounting frame 104 can include electrical traces or runners 136 that can electrically interconnect electrical circuitry found on one of the substrates 114–120 to one or more of the other substrates.

In order to further enhance the heat dissipation of the integrated circuit or die, such as die 124, an aperture 126 is located through the substrate, as is highlighted on substrate 114. A thermally conductive device mount 138 located on heat sink 122 receives the aperture 126 in order to provide a thermal conductive path for die 124. The heat sink 122 and device mount 138, which can be integral to the heat sink, can be formed from thermally conductive material, such as nickel, silver, aluminum, copper, or other suitable heat dissipating material. Heat sink 122 can be attached to the plurality of substrates using any one of a number of known attachment materials, such as epoxy, solder, etc. The device mount(s), such as mount 138, can help in the registration of heat sink 122 against the plurality of substrates 114–120.

Figure 2:
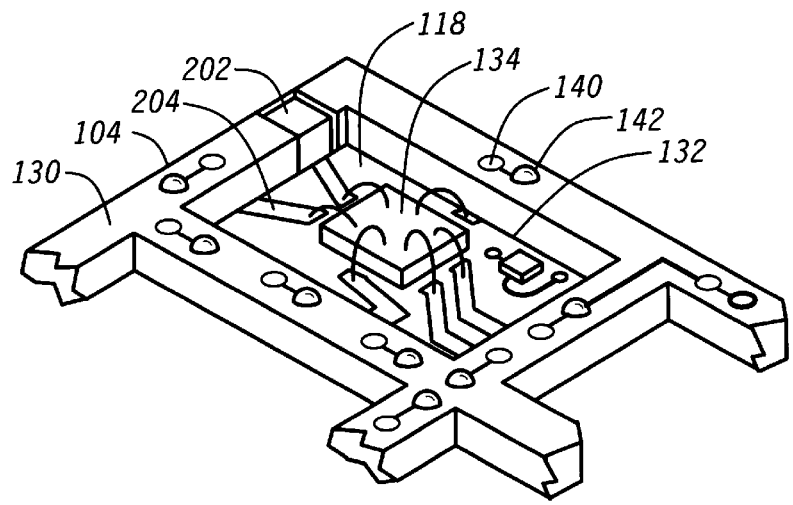
FIG. 2 shows a portion of the assembly shown in FIG. 1.

In FIG. 2 there is shown a closer view of a portion of the assembly of FIG. 1. Substrate 118 is shown attached to mounting frame 104. A plurality of conductive traces or runners, such as trace 204 provide the electrical interconnection between semiconductor 134 and mounting frame 104. The conductive vias 140 provide the electrical interconnection between the first surface 132 and second surface 130 of mounting frame 104. Instead of using conductive through vias 140, edge plated connections 202 can provide the electrical interconnection between the conductive traces 204 and the first surface 130.

Figure 3:
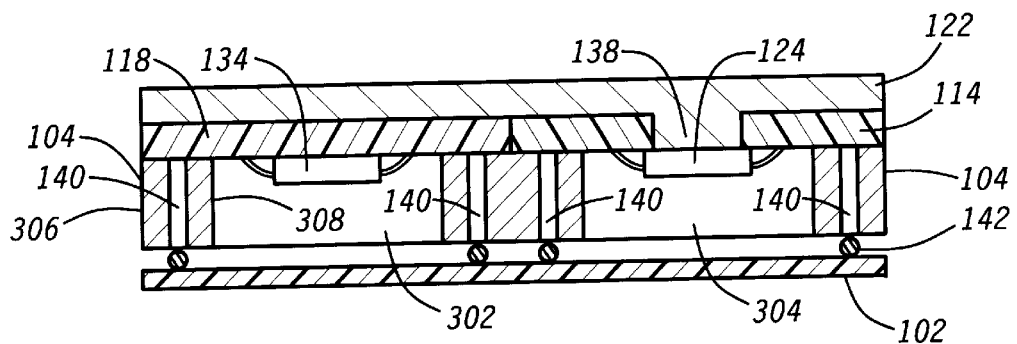
FIG. 3 shows a side cross-sectional view of the assembly of FIG. 1.

Referring to FIG. 3, there is shown a cross-sectional view of the assembly of FIG. 1. The mounting frame 104 serves as an electrical interface between substrates 114 and 118 and mother board 102. The die 124 and 134 which are in this embodiment in chip and wire form are protected by the spaces 302 and 304 formed by mounting frame 104, mother board 102 and substrates 118 and 124. As the cross-sectional view shows, the internal vias 140 (or edge plate connectors 202) provide the electrical conductors between the first and second surfaces of mounting frame 104. Device mount 138 is shown through aperture 126 and in thermal contact with semiconductor device 124 and heat sink 122.

As evident from the description above, the present invention provides for a simple and efficient way of connecting multiple electrical circuit carrying substrates 114–120. The invention allows for the individual substrates to be tested prior to final assembly, thereby increasing the manufacturing yields for the finished assembly. In order to reduce radio frequency emissions produced by the electrical circuitry, or protect the circuitry from interference such as radio frequency interference, the inner 308 and/or outer walls 306 of mounting frame may be metallized using one of a number of known techniques. The metallized walls can then be electrically connected to a grounding terminal located on motherboard 102.

While the invention has been described in conjunction with specific embodiments, it is evident that many alternatives, modifications, permutations and variations will become apparent to those skilled in the art in light of the foregoing description.

What is claimed is:

1. A surface mountable frame for mounting a plurality of substrates having electrical circuitry, comprising:

first and second surfaces;

a plurality of cavities formed through said first and second surfaces, each of said plurality of cavities designed to accommodate the electrical circuitry located on a corresponding one of said plurality of substrates; and a plurality of electrical connectors interconnecting the first and second surfaces, said first surface having interconnection pads coupled to said electrical connectors for electrically coupling to the electrical circuitry found on the plurality of substrates.

2. A surface mountable frame for mounting a plurality of substrates as defined in claim 1, wherein at least one electrical conductor electrically couples the electrical circuitry found on one of the plurality of substrates to the electrical circuitry found on another of said plurality of substrates.

3. A surface mountable frame for mounting a plurality of substrates as defined in claim 1, wherein the frame is formed from glass epoxy.

4. A surface mountable frame for mounting a plurality of substrates as defined in claim 1, further comprising a plurality of surface mountable contacts located on the second surface for surface mounting the surface mountable frame.

5. A surface mountable frame for mounting a plurality of substrates as defined in claim 4, wherein the surface mountable contacts located on the second surface comprise solder deposits.

6. A surface mountable frame for mounting a plurality of substrates as defined in claim 5, wherein the solder deposits comprise collapsible solder balls.

7. A surface mountable frame for mounting a plurality of substrates as defined in claim 1, wherein the mounting frame has walls that are metallized.

8. A surface mountable frame for mounting a plurality of substrates as defined in claim 1, wherein the electrical conductors comprise conductive vias which traverse from the first to the second surface.

9. A surface mountable frame for mounting a plurality of substrates as defined in claim 1, wherein at least one of the electrical conductors comprises an edge plated connector.

10. A leadless surface mountable assembly for mounting multiple substrates, comprising:

first and second substrates having electrical circuitry disposed thereon; and a surface mountable frame, including:

first and second surfaces, first and second cavities formed through said first and second surfaces, said first cavity designed to accommodate the electrical circuitry located on said first substrate and said second cavity designed to accommodate the electrical circuitry located on said second substrate, a plurality of electrical conductors interconnecting the first and second surfaces, said first surface having electrical contacts electrically coupled to said electrical conductors for electrically interconnecting to the electrical circuitry found on the first and second substrates.

11. A leadless surface mountable assembly as defined in claim 10, further comprising electrical contacts electrically coupled to said plurality of electrical conductors, located on the second surface of the surface mountable frame.

12. A leadless surface mountable assembly as defined in claim 11, wherein the electrical contacts located on the second surface comprise a plurality of surface mountable contacts.

13. A leadless surface mountable assembly as defined in claim 12, wherein the surface mountable contacts located on the second surface include solder deposits.

14. A leadless surface mountable assembly as defined in claim 13, wherein the solder deposits comprise collapsible solder balls.

15. A leadless surface mountable assembly as defined in claim 10, wherein the first and second substrates each have first and second surfaces and the first surface of the first and second substrates is attached to the first surface of the surface mountable frame; and further comprising:

a heat sink thermally coupled to some of the electrical circuitry located on the first and second substrates.

16. A leadless surface mountable assembly as defined in claim 15, wherein the first substrate has an aperture and the heat sink further includes a thermally conductive device mount which mates with the aperture.

* * * * *